United States Patent [19]
Akyürek et al.

[11] Patent Number: 5,382,830
[45] Date of Patent: Jan. 17, 1995

[54] SEMICONDUCTOR MODULE WITH MULTI-PLANE CONDUCTIVE PATH

[76] Inventors: Altan Akyürek, Eichenhain 32/12; Peter Maier, Hugo-Dietz-Str. 19, both of 8560 Lauf; Jürgen Schulz-Harder, Am Stadtwald 2, 8489 Eschenbach, all of Germany

[21] Appl. No.: 810,726
[22] Filed: Dec. 18, 1991

[30] Foreign Application Priority Data

Dec. 18, 1990 [DE] Germany .............................. 9017041

[51] Int. Cl.⁶ .............................................. H01L 23/02
[52] U.S. Cl. .................................. 257/701; 257/705; 361/637; 361/807
[58] Field of Search ................ 357/74; 174/52.1, 52.2; 257/433, 701, 705, 703; 361/807, 637, 736, 737, 742

[56] References Cited

U.S. PATENT DOCUMENTS

| | | | |
|---|---|---|---|
| 4,604,677 | 8/1986 | Suzuki et al. | 174/52.1 |
| 4,818,099 | 4/1989 | Preikshat et al. | 257/433 |
| 5,002,493 | 3/1991 | Brown et al. | 361/736 |
| 5,067,006 | 11/1991 | Shiga | 257/782 |

FOREIGN PATENT DOCUMENTS

3137570 9/1981 Germany .

*Primary Examiner*—Rolf Hille
*Assistant Examiner*—Roy Potter
*Attorney, Agent, or Firm*—Ostrolenk, Faber, Gerb & Soffen

[57] ABSTRACT

For the manufacture of a power semiconductor module, one proceeds from a ceramic base board on which copper plates and copper conductor paths are fastened by a suitable method. The ceramic base plate is then scratched and broken. As a result, ceramic side boards are produced which are connected to the base board via conductive paths. The side boards are then swung up, as a result of which the conductive paths fastened on the side boards come into a plane above the base plane. By means of suitable, possibly multiple, breaking and folding of the side boards and suitable development of the ends of the conductive paths, the connecting poles of the power semiconductor chips can be directly contacted. Electronic circuits can be arranged on the side boards.

15 Claims, 1 Drawing Sheet

SEMICONDUCTOR MODULE WITH MULTI-PLANE CONDUCTIVE PATH

BACKGROUND OF THE INVENTION

The present invention relates to a semiconductor module with a base board and a side board in intersecting planes and to a conductor on a conductive path extending between the base board, and the side board, and the invention particularly relates to assurance of required dielectric strength between the adjacent boards of the semiconductor module.

Semiconductor modules in which one or more semiconductor chips, particularly high-power semiconductor chips, are installed in a housing which is developed in such a manner that heat loss produced in the semiconductor chips can be discharged in optimal fashion to the surrounding, are manufactured and used in large numbers. If the semiconductor chips are to be electrically insulated from their surroundings, a base plate of a ceramic material, for instance aluminum oxide, aluminum nitride, beryllium oxide, etc. is frequently used. The required conductive paths, etc. are produced on the surface thereof. In this connection, copper sheets which are fastened to the ceramic boards by the so-called direct bonding process have proven particularly satisfactory.

If only a few semiconductor chips are combined in a module, a simple, economical construction which is very dependable in operation is obtained. However, as soon as a larger number of semiconductor chips are to be combined in a module, and particularly when these chips are at least in part controllable semiconductor elements such as thyristors, transistors, etc., crossings of the conductive paths are necessary, for which, to be sure, for the feeding of current to the control electrodes of the controllable semiconductor elements, lines of small cross section are sufficient. But, they however must be insulated and fixed in suitable manner in order to avoid damage or short circuits.

Examples of the complicated production of conductive paths which extend in a second plane are given in Federal Republic of Germany Patent 31 37 570. The second plane of the conductor path is formed by pre-shaped wires and sheets which are mounted and soldered by hand. It is obvious that the reliability is decreased as a result of the large number of solder points, and the cost of manufacture increased.

Another method of producing crossings in the case of copper conductive paths which are connected to a ceramic substrate by the direct bonding process is known from U.S. Pat. No. 4,500,029. In that method, parts of the copper sheets are prevented by suitable coatings from bonding to the ceramic substrate and/or other copper sheets. This method is extremely difficult in actual practice. The crossings are mechanically unstable since the copper becomes soft as a result of the heat treatment. In many cases, the crossings produced do not have the desired insulating action.

SUMMARY OF THE INVENTION

The object of the present invention is to provide a semiconductor module of the aforementioned type which has conductive paths which extend in a second, third and so on plane but which can be produced at the same time as the conductive paths of the first plane in one and the same operation.

This object is achieved by a semiconductor module of the type having a base board, at least one side board at an angle, particularly a right angle, to the base board, a conductor defining a conductive path extending from the base board to the side board, a contact plate on the base board, a semiconductor chip fastened on the contact plate and electrically connected with the conductive path. The conductive path extends from the chip on the base board to the side board and to an electric connection. In order to provide the required dielectric strength, the base board and the angled side board are separated by a space corresponding to the required dielectric strength to be maintained.

The present invention thus proceeds from a development of the pattern of the conductive paths of the finished module on the plane of the base surface. In this way it is possible, as previously, to produce contact sheets, conductive-path sheets and base sheet in one operation, e.g. bond them to the ceramic in a single pass through the furnace in the case of the preferred direct bonding process. The ceramic boards can lie alongside of each other in a suitable mount and be covered with the prepared sheets. Preferably, however, one proceeds from a single one-piece base plate of ceramic which, after the completion of the contact surfaces and conductive paths, is scratched or broken from the rear in order in this way to produce the desired individual boards.

The ceramic boards which are connected to each other by the metal sheets are then folded into a three-dimensional structure, as a result of which the conductive paths come into the second, third and so on plane as desired.

In order to be able to assure the required dielectric strength, it is necessary to assure a sufficient distance between adjacent ceramic boards and their electrically conductive regions. In order to make this possible, it is advisable to see to it that the conductive-path sheet remains without attachment to the ceramic in the boundary region between two boards. For this purpose, one can either provide a separating mask between board and conductive-path sheet, or the conductive-path sheet can be pre-shaped in bridge-like manner.

If it is desired to connect the end of the conductive-path directly to a connecting terminal of the semiconductor chip, for instance to the control electrode of a thyristor or transistor, it is advisable to see to it by the above-mentioned measures that the end of the conductive-path sheet also remains without connection to the ceramic.

Finally, the side boards also have sufficient area to receive a complete electronic unit, for instance a control electronic unit for the power semiconductor chips. Due to the separation of the side boards from the base board, which is subjected to high thermal load, only relatively little heat is transmitted to the side boards so that they can generally remain without special cooling.

Other features and advantages of the present invention will become apparent from the following description of the invention which refers to the accompanying drawings.

BRIEF DESCRIPTION OF THE DRAWINGS

Embodiments of the invention will be explained in further detail with reference to the drawing, in which.

DESCRIPTION OF THE PREFERRED EMBODIMENTS

Figure 1:
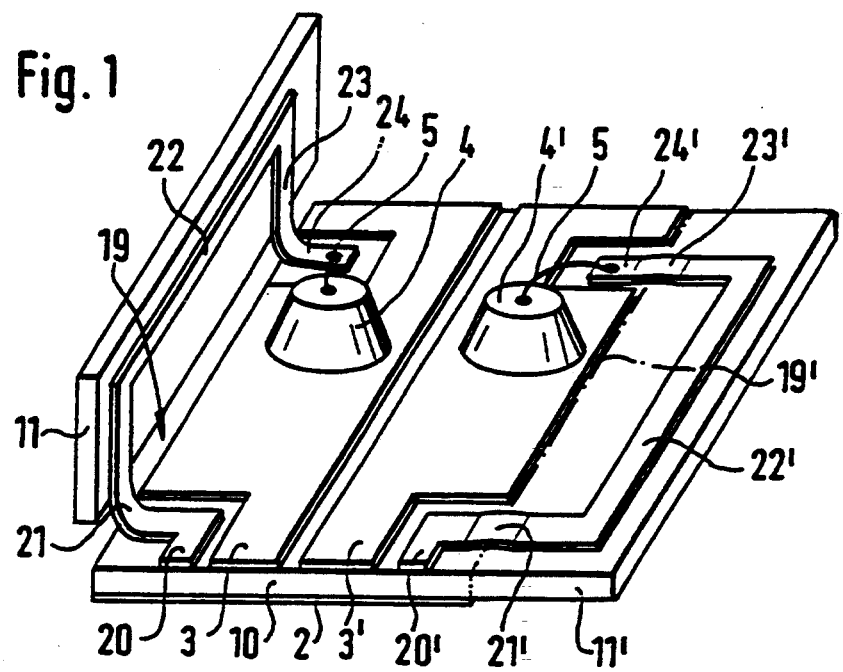
FIG. 1 is a perspective view of a first embodiment of a semiconductor module.

FIG. 1 shows a ceramic board 10 which bears a base plate 2 on its lower side, and two contact plates 3, 3' on its top. The ceramic board 10 is comprised either of aluminum oxide or beryllium oxide. The contact plates as well as the below described conductive path are comprised of copper, possibly copper mixed with cuprous oxide. Semiconductor chips 4, 4' are soldered on the contact plates 3, 3' respectively.

After the completion of all conductive paths and contact surfaces, the ceramic base board 10 is scratched and broken along a parting line 19' (shown in dot-dash line), so that side boards 11, 11', separate from the ceramic base board 10, are produced which are, for instance, bent up vertically, like the side board 11 shown on the left side of the figure. Additional conductive paths 20, 20' connect the ceramic base board 10 and the side parts 11, 11'. By the swinging up of the side parts 11, 11', the conductive paths 22, 22' pass, as desired, into the second plane and an extremely compact construction with crossings is obtained.

In order to be able to guarantee the dielectric strength which is required in actual practice, a sufficient distance 19 must be maintained between ceramic base board 10 and side boards 11, 11' and between their electrically conductive parts. However, this is only possible if the conductor-path plates 20, 20' are not attached to the ceramic in the boundary region between two boards 10 and 11, 11'. This is achieved, for instance, by a bridge-like pre-forming 21', 23' of the conductive-path plates 20, 20'.

As an alternative to this, a separation mask can also be provided between ceramic 10, 11, 11' and conductor-path region 21', 23'.

Figure 2:
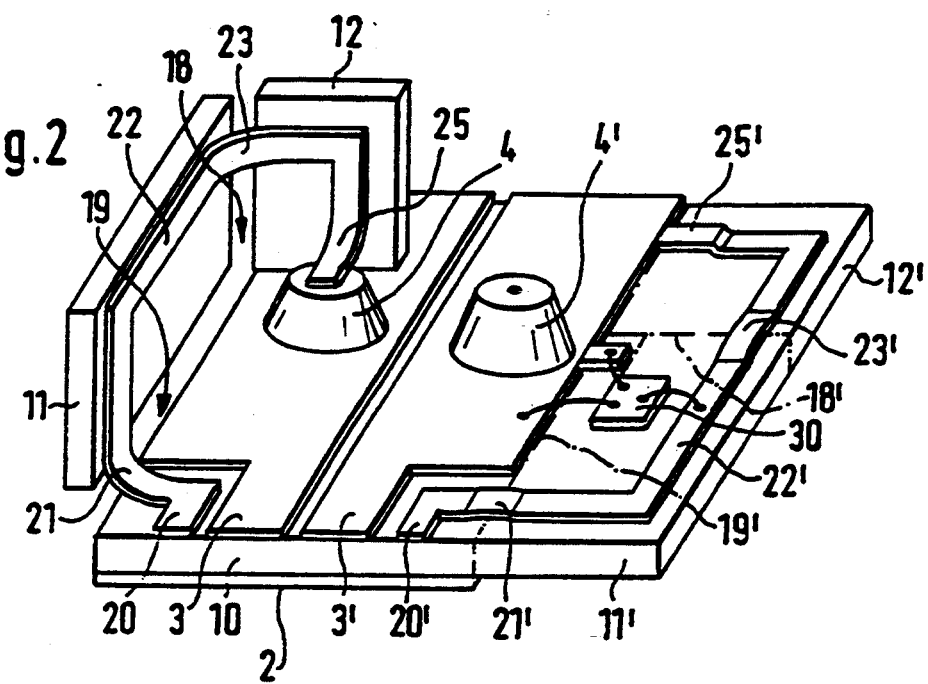
FIG. 2 is a perspective view of a second embodiment of a semiconductor module.

FIG. 2 shows an embodiment in which, alongside the base plate 10, there are provided in each case two side parts 11, 11', 12, 12'. Manufacture is again effected starting from a single ceramic board, all plates 2, 3, 3', 20, 20' lying in the base plane being connected to the ceramic upon one pass through an oven. The ceramic is then scratched from the rear side along the parting lines 18', 19' and broken and then folded, as shown in the drawing. The free ends 25, 25' of the conductor-path plates 20, 20' can be bent and soldered directly to the connecting contacts of the semiconductor chips 4, 4'. As shown in FIG. 2, the side board 11' carries an electronic control unit 30 which is electrically connected to the contact plate 3' and to the conductive path 20'.

As can be noted from FIGS. 1 and 2, the side boards 11, 11', 12, 12' provide sufficient space to receive several conductor-path plates. As a result of the separation of the side boards from the base board furthermore, only a small amount of heat is transferred to the side boards. The latter can thus receive complete electronic units, for instance for the formation of control signals for the power semiconductor chips 4, 4'.

Figure 3:
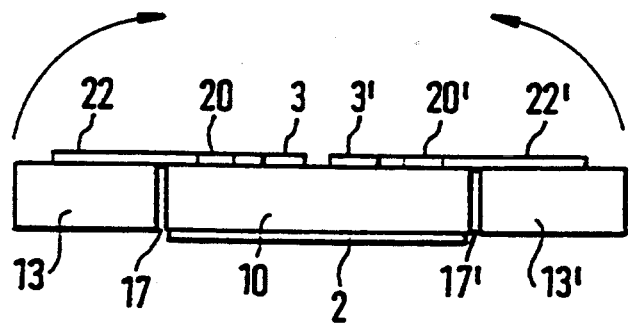
FIG. 3 is a front view of a third embodiment of a starting board for the production of a semiconductor module.

FIG. 3, finally, shows diagrammatically that base board 10 and side boards 13, 13' can be separate already from the very start, as a result of which sufficiently dimensioned spaces 17, 17' can be maintained. To be sure, it must be seen to it by suitable mounts that the ceramic boards 10, 13, 13' retain their position with respect to each other during the bonding of the copper plates 2, 3, 3', 20, 20'.

Regardless of whether one starts from a single ceramic board or from several ceramic boards, the invention affords the possibility of connecting all conductive paths and contact surfaces in a single plane in one operation to the ceramic and then, by single or multiple folding of the side boards, to produce a compact module having conductor paths and contact surfaces in several planes without additional connecting clips, bridges, wires and/or insulation parts having to be mounted by hand.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor module comprising:
 a base board;
 a contact plate supported on the base board;
 a semiconductor chip fastened to the contact plate on the base board;
 a side board disposed at an angle relative to the base board and being separated therefrom by a space located between the side board and the base board; and
 a conductor located on the base board and the side board for defining a conductive path, the conductive path being connected with the semiconductor chip, the conductor extending from the base board, across the space to the side board, the space between the base board and the side board having a predetermined size so as to maintain a predetermined dielectric strength between the base board and the side board.

2. The semiconductor module of claim 1, wherein the base board and the side board are both formed of a ceramic material.

3. The semiconductor module of claim 1, wherein the base board is disposed to be approximately perpendicular to the side board.

4. The semiconductor module of claim 1, wherein the base board and the side board had been of one piece which was separated to define the space between the base board and the side board.

5. The semiconductor module of claim 1, wherein the semiconductor chip has a connection pole and the conductor has a part that directly contacts the connection pole of the semiconductor chip.

6. The semiconductor module of claim 5, wherein the conductor has an end that is not connected to either of the base board and the side board.

7. The semiconductor module of claim 1, wherein the conductor has a boundary region between the base board and the side board at which the conductor is not connected to the base board and the side board.

8. The semiconductor module of claim 7, further comprising a separating mask between the conductive path and at least one of the base board and the side board generally at the boundary region.

9. The semiconductor module of claim 7, wherein the conductor includes a preformed bridge shape which spans the boundary region between the base board and the side board.

10. The semiconductor module of claim 1, further comprising an electronic control unit on the side board and connected with the conductor on the side board and with the contact plate on the base board.

11. The semiconductor module of claim 1, wherein the contact plate and the conductors are comprised of materials selected from the group consisting of copper and copper with cuprous oxide.

12. The module of claim 1, wherein the base board and the side board are comprised of materials selected from the group consisting of aluminum oxide and beryllium oxide.

13. The semiconductor module of claim 12, wherein the contact plate and the conductor are connected to the base board and to the side board by a metal-gas eutectic.

14. The semiconductor module of claim 1, wherein the conductor is fixedly connected to the base and to the sideboard and supports the sideboard.

15. A semiconductor module comprising:
 a base board;
 a contact plate supported on the base board;
 a semiconductor chip fastened to the contact plate on the base board;
 a side board disposed at an angle relative to the base board and being separated therefrom by a space located between the side board and the base board; and
 a conductor located on the base board and the side board for defining a conductive path, the conductive path being connected with the semiconductor chip, the conductor extending from the base board, across the space to the side board, the space between the base board and the side board having a predetermined size so as to maintain a predetermined dielectric strength between the base board and the side board; wherein
 the base board and the side board are both formed of a ceramic material.

* * * * *